(12) United States Patent
Yagasaki

(10) Patent No.: US 10,587,151 B2
(45) Date of Patent: Mar. 10, 2020

(54) WIRELESS TRANSMISSION DEVICE AND WIRELESS COMMUNICATION DEVICE

(71) Applicant: RENESAS ELECTRONICS CORPORATION, Tokyo (JP)

(72) Inventor: Tomoumi Yagasaki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/411,549

(22) Filed: May 14, 2019

(65) Prior Publication Data

US 2019/0386520 A1 Dec. 19, 2019

(30) Foreign Application Priority Data

Jun. 18, 2018 (JP) .................................. 2018-115188

(51) Int. Cl.
| | |
|---|---|
| H03F 1/02 | (2006.01) |
| H03F 3/217 | (2006.01) |
| H02J 50/20 | (2016.01) |
| H03H 7/42 | (2006.01) |
| H03H 7/38 | (2006.01) |
| H03F 3/19 | (2006.01) |

(52) U.S. Cl.
CPC ................ *H02J 50/20* (2016.02); *H03F 3/19* (2013.01); *H03F 3/2171* (2013.01); *H03H 7/38* (2013.01); *H03H 7/42* (2013.01)

(58) Field of Classification Search
CPC . H03F 1/02; H03F 1/0277; H03F 3/20; H03F 3/21; H03F 3/211; H03F 3/217
See application file for complete search history.

(56) References Cited

U.S. PATENT DOCUMENTS 9,641,141 B1 * 5/2017 Zheng .................... H03F 3/2171
10,454,426 B2 * 10/2019 Fikstvedt ................ H03F 3/195
(Continued)

OTHER PUBLICATIONS

Wei-Han Yu et al., "A High-Voltage-Enabled Class-D Polar PA Using Interactive Am-Am Modulation, Dynamic Matching, and Power-Gating for Average PAE Enhancement", IEEE Transaction on Circuit and Systems—I: Regular Papers, vol. PP, Issue: 99, pp. 1-14, May 31, 2017.

*Primary Examiner* — Blane J Jackson
(74) *Attorney, Agent, or Firm* — McDermott Will & Emery LLP

(57) ABSTRACT

A wireless transmission device includes an input terminal, control terminals, an amplifying circuit, a matching circuit, and an output terminal coupled to the output of the matching circuit. The amplifying circuit includes unit amplifiers and capacitive elements. Each unit amplifier includes a sub-input terminal, a sub-control terminal, and a sub-output terminal. The sub-input terminal is coupled to the input terminal, the sub-control terminal is coupled to the corresponding control terminal in the control terminals, and the sub-output terminal is coupled to the input of the matching circuit through the corresponding capacitive element in the capacitive elements in series. Each unit amplifier includes a tri-state-type class-D amplifier. The sub-output terminal of each unit amplifier is set to a low level state, a high level state, or a high impedance state based on a control signal supplied to the sub-control terminal or an input signal supplied to the sub-input terminal.

17 Claims, 12 Drawing Sheets

(56) References Cited

U.S. PATENT DOCUMENTS

2007/0298736 A1* 12/2007 Fujioka ............... H03F 1/0266
                                                    455/127.3
2016/0043698 A1*  2/2016 Banerjee ............... H03F 1/42
                                                    330/305

* cited by examiner

FIG. 5

Sel1

| en1 | RFIN | o | STATE |
|---|---|---|---|
| 0 | 0 | 1 | SIGNAL BLOCK (FIXED TO H) |
| 0 | 1 | 1 | |
| 1 | 0 | 0 | RF SIGNAL OUTPUT(L) |
| 1 | 1 | 1 | RF SIGNAL OUTPUT(H) |

FIG. 6

SWamp1

| EN1 | IN1 | OUT1 | STATE |
|---|---|---|---|
| 0 | 0 | Hi-Z | SIGNAL BLOCK (FIXED TO Hi-Z) |
| 0 | 1 | Hi-Z | |
| 1 | 0 | 1 | RF SIGNAL OUTPUT(H) |
| 1 | 1 | 0 | RF SIGNAL OUTPUT(L) |

FIG. 13A
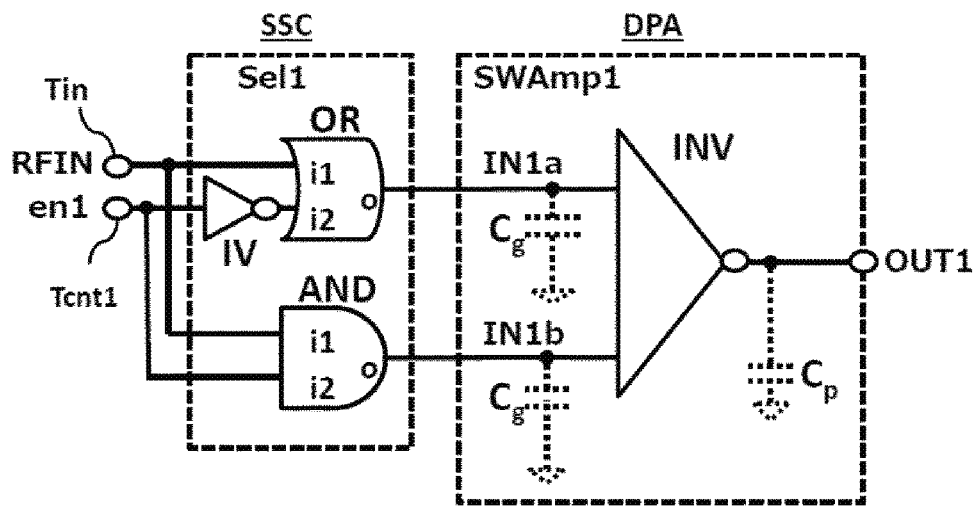
FIG. 13B
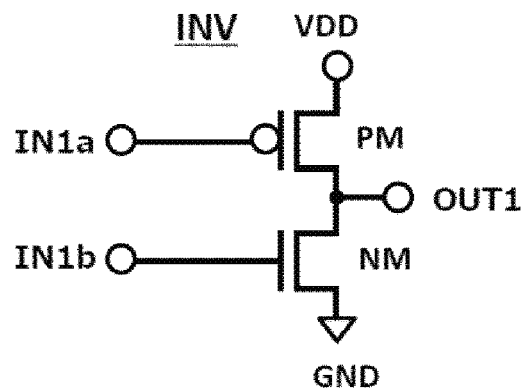
FIG. 13C
| en1 | RFIN | IN1a | IN1b | OUT1 | STATE |
|-----|------|------|------|------|-------|
| 0 | 0 | 1 | 0 | Hi-Z | BLOCK |
| 0 | 1 | 1 | 0 | Hi-Z | BLOCK |
| 1 | 0 | 0 | 0 | RF(H) | RF(H) |
| 1 | 1 | 1 | 1 | RF(L) | RF(L) |

WIRELESS TRANSMISSION DEVICE AND WIRELESS COMMUNICATION DEVICE

CROSS-REFERENCE TO RELATED APPLICATIONS

The disclosure of Japanese Patent Application No. 2018-115188 filed on Jun. 18, 2018 including the specification, drawings and abstract is incorporated herein by reference in its entirety.

BACKGROUND

The disclosure relates to a wireless transmission device and a wireless communication device, and can be particularly applied to a wireless transmission device and a wireless communication device using a plurality of class-D amplifiers.

In recent years, there has been an increased demand for computer devices and mobile terminals using wireless communications such as Bluetooth (registered trademark) that is one of short-range wireless communication standards for digital devices. In addition, there has been a request of forming a wireless transmission device on one chip to be mounted in a wearable device, and wireless transmission devices are increasingly mounted into semiconductor devices such as microcomputers or SoC (System on a Chip). It has been considered to use a class-D amplifier as a power amplifier in a wireless transmission device adapting to the Bluetooth standard.

An example of a technique using a class-D amplifier as a power amplifier is proposed in, for example, "Wei-Han Yu et al., "A High-Voltage-Enabled Class-D Polar PA Using Interactive AM-AM Modulation, Dynamic Matching, and Power-Gating for Average PAE Enhancement", IEEE TRANSACTION ON CIRCUIT AND SYSTEMS-I: REGULAR PAPERS, vol. PP, Issue: 99, pp. 1-14, 31 May 2017" (hereinafter, referred to as Yu Literature). With reference to FIG. 3 of Yu Literature, in order to control a transmission electric power (Pout), the number of class-D amplifier units that are coupled in parallel and perform a class-D amplifying operation is adjusted. The class-D amplifier units that are not allowed to perform a class-D amplifying operation become an OFF state by internal switch control, and become an open (Hi-Z) state when seen from the VD end. Impedance ($Z_{DMN}$) when seeing a matching unit (DMN) from the VD end is adjusted by only a capacitance $C_{DMN}$.

SUMMARY

According to consideration by the inventors, there has been a need of, in particular, a reduction in electric power consumption and a high output of transmission electric power in a wireless transmission device adapting to the Bluetooth standard. It has been desired to achieve both characteristics of a reduction in electric power consumption and a high output of transmission electric power that are essentially in a trade-off relation by using the same circuit configuration.

By the way, when the transmission electric power is to be decreased, the parasitic capacitance (for example, the drain-source capacitance of a MOS configuring a unit) of the unit in an OFF state is disadvantageously seen as it is from the output of the unit that performs a class-D amplifying operation in Yu Literature. Therefore, in the case where the number of units in an OFF state is large, there is a risk that a loss caused by the parasitic capacitance is increased, deteriorating the electric power efficiency.

In addition, it is necessary to set the impedance ($Z_{DMN}$) when seeing the antenna side from the output of the class-D amplifier to the optimum impedance that is determined on the basis of a necessary transmission electric power and power supply voltage. However, in the case where a small transmission electric power is efficiently output, it is necessary to increase the impedance ($Z_{DMN}$). On the other hand, in the case where a large transmission electric power is output, it is preferable to decrease the impedance ($Z_{DMN}$). In Yu Literature in which a capacitance $C_{AC}$ is fixed, it is possibly difficult to realize wide-range impedance adjustment.

In addition, a differential configuration of a class-D amplifier is excellent in outputting a large transmission electric power, but poor in efficiently outputting a small transmission electric power. Thus, it is more important to adjust the impedance ($Z_{DMN}$). In Yu Literature, the impedance is adjusted by only a switch capacitance array (SCA). Thus, it is difficult to increase the impedance ($Z_{DMN}$), and there is a risk that an electric power loss is increased because the number of units that perform a class-D amplifying operation, namely, only the on-resistance Ron (for example, the on-resistance of a MOS) is changed.

An object of the disclosure is to provide a wireless transmission device whose electric power efficiency can be improved even when an output electric power is decreased.

The other objects and novel features will become apparent from the description of the specification and the accompanying drawings.

The following is a summary of the representative outline of the disclosure.

Namely, a wireless transmission device includes an input terminal, a plurality of control terminals, an amplifying circuit, a matching circuit having an input and an output, and an output terminal coupled to the output of the matching circuit. The amplifying circuit includes a plurality of unit amplifiers and a plurality of capacitive elements. Each of the unit amplifiers includes a sub-input terminal, a sub-control terminal, and a sub-output terminal. The sub-input terminal is coupled to the input terminal, the sub-control terminal is coupled to the corresponding control terminal in the control terminals, and the sub-output terminal is coupled to the input of the matching circuit through the corresponding capacitive element in the capacitive elements in series. Each of the unit amplifiers includes a tri-state-type class-D amplifier. The sub-output terminal of each of the unit amplifiers is set to a low level state, a high level state, or a high impedance state on the basis of a control signal supplied to the sub-control terminal or an input signal supplied to the sub-input terminal.

According to the above-described semiconductor device, it is possible to improve the electric power efficiency even when an output electric power is decreased.

BRIEF DESCRIPTION OF THE DRAWINGS

FIG. 5 is a diagram for showing an operation state of the selection circuit Sel1 of FIG. 3;

FIG. 6 is a diagram for showing an operation state of the first unit amplifying circuit SWAmp1 of FIG. 3;

FIGS. 13A, 13B and 13C are diagrams each explaining a configuration example of a first unit amplifier and a first selection circuit according to a third modified example.

DETAILED DESCRIPTION

Hereinafter, embodiments, examples, and modified examples will be described using the drawings. However, the same constitutional elements will be followed by the same signs in the following description, and the repeated explanation thereof will be omitted in some cases. It should be noted that the drawings are schematically shown in some cases as compared to actual modes in order to more clarify the explanation. However, the drawings are only examples, and do not limit the interpretation of the present invention.

It should be noted that a wireless transmission device described in the disclosure can be used for a constant envelop modulation-type wireless transmission device, a semiconductor device for Bluetooth, a semiconductor device for Bluetooth Low Energy (registered trademark), a semiconductor device for ZigBee (registered trademark) (IEEE802.15.4g), a semiconductor device for a smart meter, an SoC incorporating a wireless transmission device, and a microcomputer incorporating a wireless transmission device.

Embodiment

Figure 1:
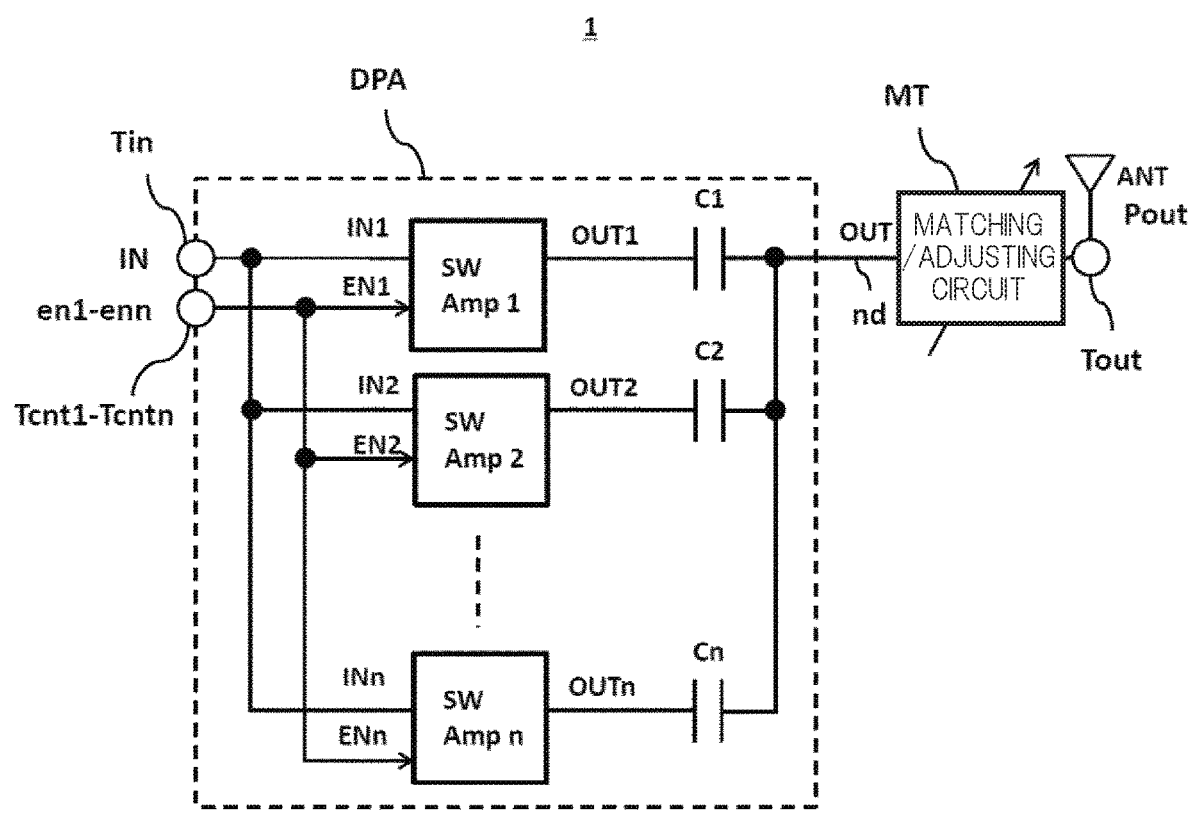
FIG. 1 is a diagram for showing a configuration example of a wireless transmission device according to an embodiment.

FIG. 1 is a diagram for showing a configuration example of a wireless transmission device according to an embodiment.

A wireless transmission device 1 is configured using a semiconductor device formed on one semiconductor chip except for an antenna ANT, and includes an amplifying circuit DPA and a matching/adjusting circuit MT. The amplifying circuit DPA configures a power amplifier that amplifies the electric power of an input signal IN by performing a class-D amplifying operation. The matching/adjusting circuit MT adjusts impedance matching at an end of the antenna ANT, and supplies to an output terminal Tout as a transmission signal of an output signal OUT output from the amplifying circuit DPA. The transmission signal supplied to the output terminal Tout is transmitted from the antenna ANT coupled to the output terminal Tout as a radio signal of transmission electric power (Pout). The matching/adjusting circuit MT includes, for example, a π-type rematching circuit and an adjusting circuit adjusting a matching constant.

The amplifying circuit DPA includes first to N-th unit amplifiers (a plurality of unit amplifying circuits) SWAmp1 to SWAmpn. An input signal IN input to an input terminal Tin is coupled to sub-input terminals IN1 to INn of the first to N-th unit amplifiers SWAmp1 to SWAmpn. The output signal OUT is coupled to sub-output terminals OUT1 to OUTn of the first to N-th unit amplifiers SWAmp1 to SWAmpn through first to N-th output capacitive elements C1 to Cn provided in series. In other words, when one unit amplifier and one output capacitance are one circuit unit (for example, SWAmp1 and C1) and a node nd is a node of an input of the matching/adjusting circuit MT or a node of the output signal OUT, a plurality of circuit units can be regarded as being provided in parallel between the input terminal Tin and the node nd. Each of the first to N-th output capacitive elements C1 to Cn has a capacitance value of, for example, about several femtos.

Control signals en1 to enn input to control terminals Tcnt1 to Tcntn are coupled to sub-control terminals EN1 to ENn of the first to N-th unit amplifying circuits SWAmp1 to SWAmpn. The first to N-th unit amplifying circuits SWAmp1 to SWAmpn are controlled to perform the class-D amplifying operation by being turned on or controlled to be turned off on the basis of the control signals en1 to enn supplied to the sub-control terminals EN1 to ENn. Namely, each of the first to N-th unit amplifying circuits SWAmp1 to SWAmpn is a tri-state-type class-D amplifying circuit. Each state of the sub-output terminals OUT1 to OUTn of the first to N-th unit amplifying circuits SWAmp1 to SWAmpn is controlled to be in one state (an L state, an H state, or an Hi-Z state) among three states (a low level (L) state, a high level (H) state, and a high-impedance (Hi-Z) state) on the basis of the input signal IN and the control signal en1 to enn.

The control of the transmission electric power (Pout) is performed by controlling the number of unit amplifying circuits (SWAmp1 to SWAmpn) that are allowed to perform the class-D amplifying operation on the basis of the control signals en1 to enn. The parasitic capacitance of the unit amplifying circuits (SWAmp1 to SWAmpn) in the off state cannot be seen when seen from the node nd. The parasitic capacitance of the unit amplifying circuits (SWAmp1 to SWAmpn) is the parasitic capacitance caused by a P-channel MOSFET and an N-channel MOSFET configuring the unit amplifying circuit as will be described later. Thus, when the transmission electric power (Pout) is decreased, the parasitic capacitance of the unit amplifying circuits (SWAmp1 to SWAmpn) in the off state cannot be seen from the node nd. Thus, the electric power efficiency when the transmission electric power (Pout) is decreased is improved.

According to the embodiment, by coupling the first to N-th output capacitive elements C1 to Cn in series to the sub-output terminals OUT1 to OUTn of the unit amplifiers SWAmp1 to SWAmpn, respectively, the value of the parasitic capacitance when seen from each of the unit amplifiers SWAmp1 to SWAmpn that perform the class-D amplifying operation can be decreased, and the charge loss can be reduced. Thus, the electric power efficiency when the electric power of the output signal OUT is decreased can be improved as compared to the related method (Yu Literature).

In addition, according to the embodiment, when the electric power of the output signal OUT is decreased, the capacitance values of the output capacitive elements C1 to Cn can be decreased. Thus, the impedance when seeing the antenna ANT side from the sub-output terminals OUT1 to OUTn can be increased, and the on-resistance can be decreased as compared to the related method (Yu Literature). Accordingly, the electric power efficiency can be improved by reducing the heat generation loss caused by resistance.

First Example

Figure 2:
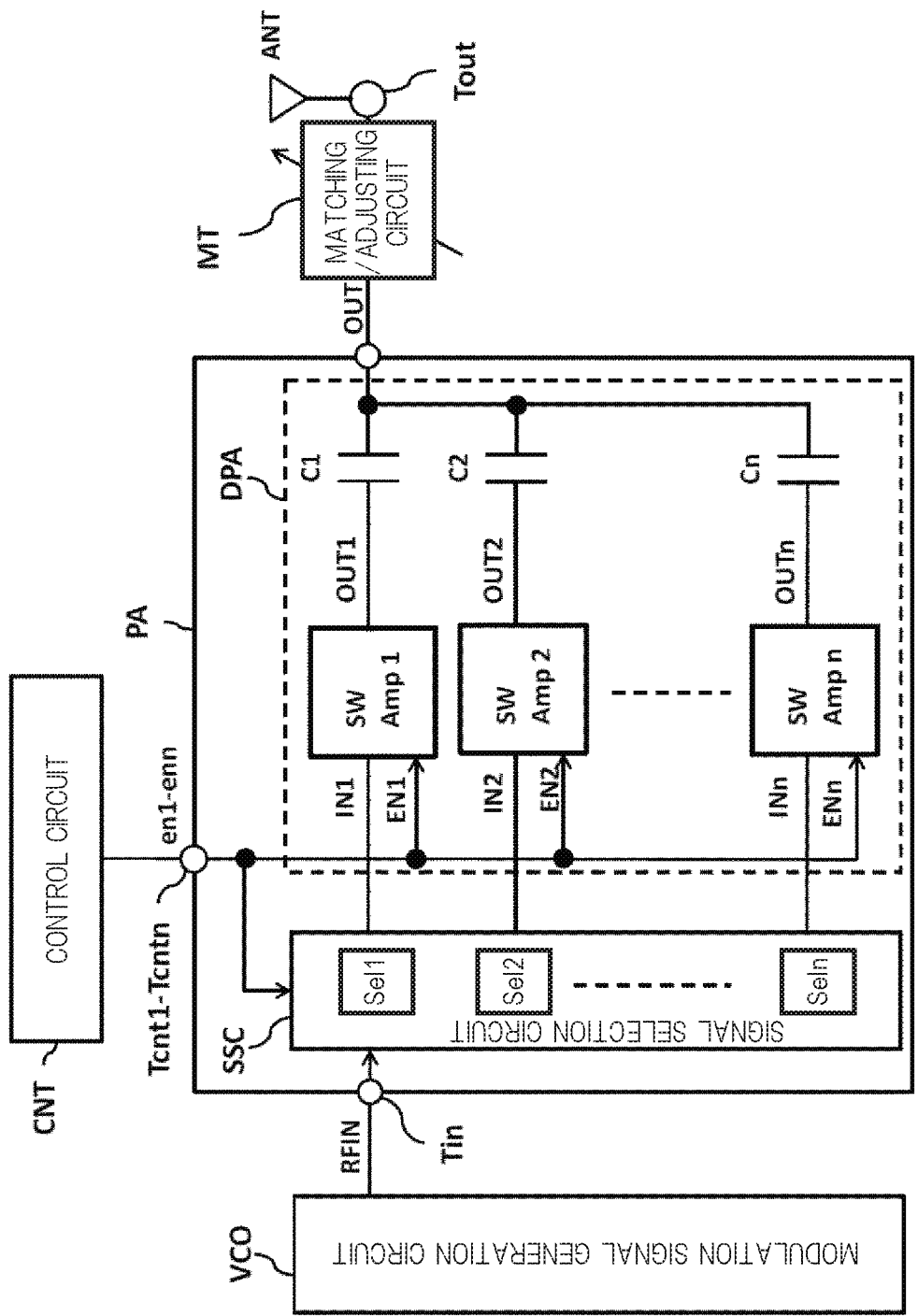
FIG. 2 is a diagram for showing a configuration example of a wireless transmission device according to a first example.

FIG. 2 is a diagram for showing a configuration example of a wireless transmission device according to a first example.

A wireless transmission device 1a shown in FIG. 2 is configured by adding a modulation signal generation circuit VCO, a signal selection circuit SSC, and a control circuit CNT to the configuration of the wireless transmission device 1 shown in FIG. 1. The other configurations are the same as those shown in FIG. 1, and thus the explanation thereof will be omitted.

The modulation signal generation circuit VCO supplies a radio frequency (RF) modulation signal (RFIN) to the input terminal Tin on the basis of transmission data. As the modulation signal generation circuit VCO, for example, a voltage control-type oscillation circuit can be used.

The signal selection circuit SSC distributes the output signal RFIN of the modulation signal generation circuit VCO to the sub-input terminals IN1 to INn of the first to N-th unit amplifying circuits SWAmp1 to SWAmpn, or blocks the same. The signal selection circuit SSC has first to N-th selection circuits Sel1 to Seln. The configurations of the first to N-th selection circuits Sel1 to Seln will be described later.

The control circuit CNT generates the control signals en1 to enn to control the signal selection circuit SSC and the first to N-th unit amplifying circuits SWAmp1 to SWAmpn. It should be noted that the amplifying circuit DPA and the signal selection circuit SSC are included in a power amplifier PA in FIG. 2.

Figure 3:
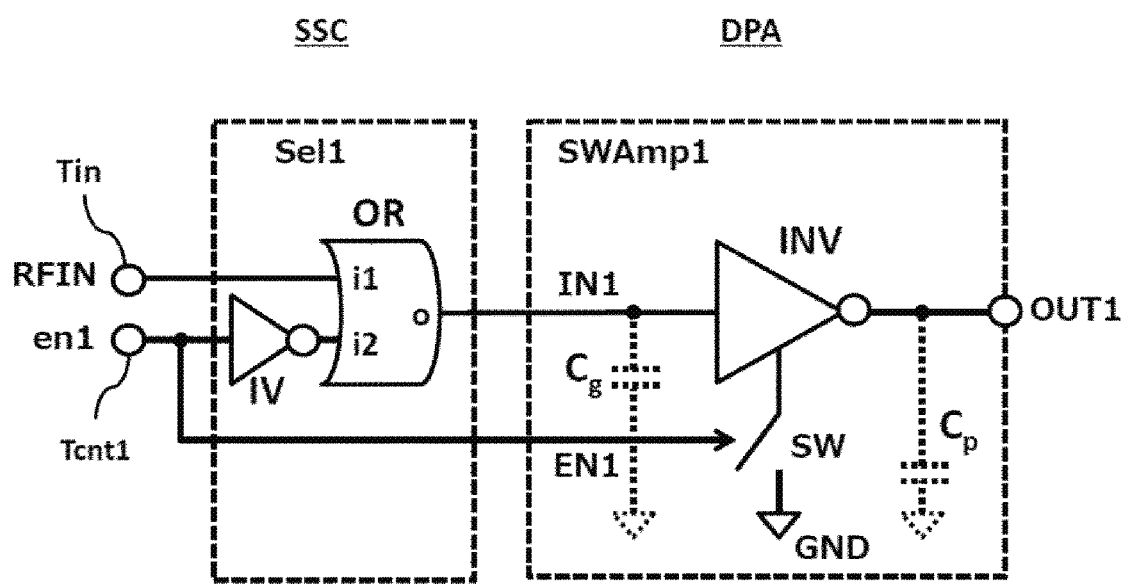
FIG. 3 is a circuit diagram for showing a configuration example of a first unit amplifier and a first selection circuit of FIG. 2.

FIG. 3 is a circuit diagram for showing a configuration example of the first unit amplifier SWAmp1 and the first selection circuit Sel1 in the signal selection circuit SSC of FIG. 2. As a representative example, the first unit amplifier SWAmp1 and the first selection circuit Sel1 are shown in FIG. 3. The configurations of the second to N-th unit amplifying circuits SWAmp2 to SWAmpn and the second to N-th selection circuits Sel2 to Seln can be the same as those of the first unit amplifier SWAmp1 and the first selection circuit Sel1 shown in FIG. 3.

The tri-state-type first unit amplifying circuit SWAmp1 includes an inverter circuit INV and a switch SW provided on the GND side of the inverter circuit INV. The sub-input terminal IN1 is the input of the inverter circuit INV, and the sub-output terminal OUT1 is the output of the inverter circuit INV. The sub-control terminal EN1 is coupled to the control terminal Tcnt1, and on and off of the switch SW are controlled by the control signal en1.

The first selection circuit Sel1 includes an OR circuit OR and an inverter circuit IV. The OR circuit OR is coupled to the input terminal Tin, and has a first input i1 to which the output signal RFIN is supplied, a second input i2 that is coupled to the control terminal Tcnt1 through the inverter circuit IV to receive the inverted signal of the control signal en1, and an output o that is coupled to the input (sub-input terminal IN1) of the inverter circuit INV of the first unit amplifying circuit SWAmp1. The input of the inverter circuit IV is the control input of the first selection circuit Sel1, and is coupled to the control terminal Tcnt1 to receive the control signal en1. The output of the inverter circuit IV is coupled to the second input i2 of the OR circuit OR.

On the basis of the control signal en1, the first selection circuit Sel1 has a first state in which the input terminal Tin and the sub-input terminal IN1 are coupled to each other and a second state in which the input terminal Tin and the sub-input terminal IN1 are disconnected from each other. In the first state, the radio frequency modulation signal RFIN supplied to the input terminal Tin is supplied from the output of the OR circuit OR to the sub-input terminal IN1 of the first unit amplifying circuit SWAmp1. In the second state, the supply of the radio frequency modulation signal RFIN supplied to the input terminal Tin to the sub-input terminal IN1 is blocked.

In FIG. 3, "Cp" is a parasitic capacitance caused from between the source and drain of the P-channel MOSFET (PM) and between the source and drain of the N-channel MOSFET (NM) configuring the inverter circuit INV of each of the unit amplifiers (SWAmp1 to SWAmpn) as will be described in FIGS. 4A, 4B, 4C and 4D. "Cg" is a parasitic capacitance caused by the gate of the P-channel MOSFET (PM) and the N-channel MOSFET (NM) configuring the inverter circuit INV of each of the unit amplifiers (SWAmp1 to SWAmpn) as will be described in FIGS. 4A, 4B, 4C and 4D.

FIGS. 4A, 4B, 4C and 4D are diagrams each showing a configuration example of the inverter circuit INV and the switch SW.

Figure 4A:
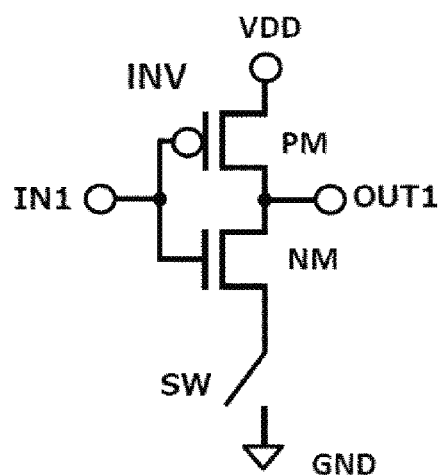
FIGS. 4A, 4B, 4C and 4D are diagrams each showing a configuration example of an inverter circuit INV and a switch SW.

FIG. 4A shows a circuit configuration example of the inverter circuit INV and the switch SW shown in FIG. 3. The inverter circuit INV includes the P-channel MOSFET (PM) and the N-channel MOSFET (NM). The source-drain route of the P-channel MOSFET (PM), the source-drain route of the N-channel MOSFET (NM), and the switch SW are coupled in series between a first reference potential VDD serving as a power supply potential and a second reference potential GND with a voltage lower than the first reference potential VDD and serving as a ground potential. In FIG. 4A, the switch SW is coupled between the source-drain route of the N-channel MOSFET (NM) and the second reference potential GND. The gate of the P-channel MOSFET (PM) and the gate of the N-channel MOSFET (NM) are coupled in common, and configure the sub-input terminal IN1. The common connection point between the source-drain route of the P-channel MOSFET (PM) and the source-drain route of the N-channel MOSFET (NM) configures the sub-output terminal OUT1. The sub-output terminal OUT1 of the inverter circuit INV can be put in the Hi-Z state by disconnecting the switch SW. The switch SW can be configured using, for example, an N-channel MOSFET. In this case, the control signal en1 may be supplied to the gate of the N-channel MOSFET.

Figure 4B:
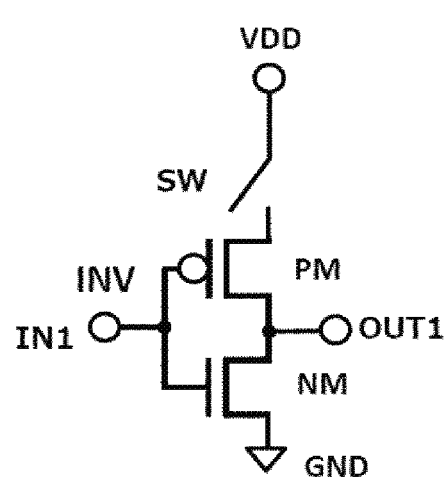

FIG. 4B is a diagram for showing a circuit configuration example of the inverter circuit INV and the switch SW shown in FIG. 3. FIG. 4B is different from FIG. 4A in that the switch SW is coupled between the first reference potential VDD and the source-drain route of the P-channel MOSFET (PM). The sub-output terminal OUT1 of the inverter circuit INV can be put in the Hi-Z state by disconnecting the switch SW. The switch SW can be configured using, for example, a P-channel MOSFET. In this case, the inverted signal of the control signal en1 may be supplied to the gate of the P-channel MOSFET.

Figure 4C:
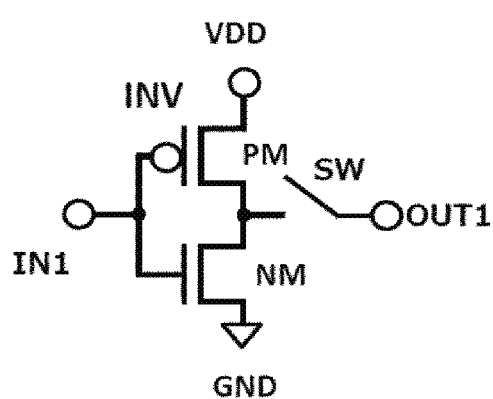

FIG. 4C is a diagram for showing a circuit configuration example of the inverter circuit INV and the switch SW shown in FIG. 3. In FIG. 4C, the switch SW is coupled between the common connection point between the source-drain route of the P-channel MOSFET (PM) and the source-drain route of the N-channel MOSFET (NM) and the sub-output terminal OUT1. In addition, the source-drain route of the P-channel MOSFET (PM) and the source-drain route of the N-channel MOSFET (NM) are coupled in series between the first reference potential VDD and the second reference potential GND. The sub-output terminal OUT1 of the inverter circuit INV can be put in the Hi-Z state by disconnecting the switch SW. The switch SW can be configured using, for example, a P-channel MOSFET, an N-channel MOSFET, or a CMOS switch configured using a P-channel MOSFET and an N-channel MOSFET. In the case where the switch SW is configured using a P-channel MOSFET, the inverted signal of the control signal en1 may be supplied to the gate of the P-channel MOSFET. In the case where the switch SW is configured using an N-channel MOSFET, the control signal en1 may be supplied to the gate of the N-channel MOSFET. In the case where the switch SW is configured using a CMOS switch, the inverted signal of the control signal en1 may be supplied to the gate of the P-channel MOSFET, and the control signal en1 may be supplied to the gate of the N-channel MOSFET.

Figure 4D:
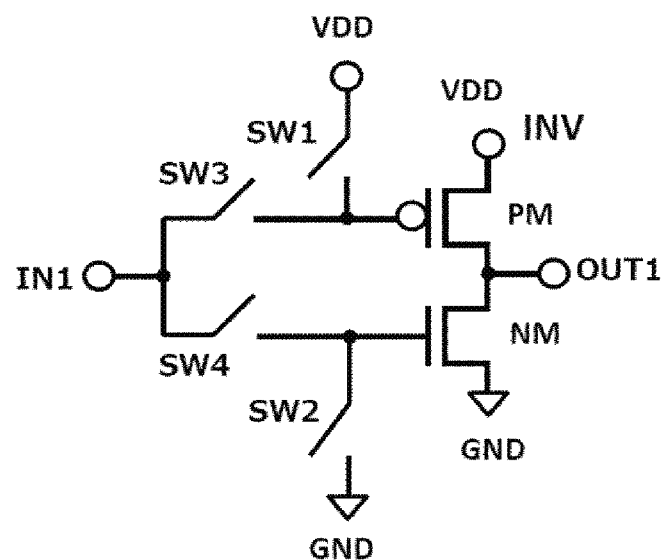

FIG. 4D is a diagram for showing a circuit configuration example of the inverter circuit INV and the switch SW shown in FIG. 3. In FIG. 4D, the switch SW is changed to a first switch SW1, a second switch SW2, a third switch SW3, and a fourth SW4. The first switch SW1 is coupled between the first reference potential VDD and the gate of the P-channel MOSFET (PM), and the second switch SW2 is coupled between the gate of the N-channel MOSFET (NM) and the second reference potential GND. The third SW is coupled between the gate of the P-channel MOSFET (PM) and the sub-input terminal (IN1), and the fourth SW is coupled between the gate of the N-channel MOSFET (NM) and the sub-input terminal (IN1). The sub-output terminal OUT1 of the inverter circuit INV can be put in the Hi-Z state by putting the gate of the P-channel MOSFET (PM) to the first reference potential VDD by the first switch SW1, by putting the gate of the N-channel MOSFET (NM) to the second reference potential GND by the second switch SW2, and by disconnecting the sub-input terminal (IN1) while turning off the third SW and the fourth SW. The first switch SW1 can be configured using, for example, a P-channel MOSFET. The second switch SW2 can be configured using, for example, an N-channel MOSFET. The third switch SW3 and the fourth switch SW4 can be configured using, for example, a CMOS switch. In this case, the following configuration may be employed. The control signal en1 is supplied to the gate of the P-channel MOSFET configuring the first switch SW1, and the inverted signal of the control signal en1 is supplied to the N-channel MOSFET configuring the second switch SW2. In addition, in the CMOS switch configuring the third switch SW3 and the fourth switch SW4, the inverted signal of the control signal en1 is supplied to the gate of the P-channel MOSFET in the CMOS switch, and the control signal en1 is supplied to the gate of the N-channel MOSFET in the CMOS switch.

It should be noted that a leak current flowing when the P-channel MOSFET (PM) and the N-channel MOSFET (NM) configuring the inverter circuit INV are turned off can be reduced by the switch SW in the circuit configuration example of the inverter circuit INV and the switch SW shown in FIG. 4A.

Next, a basic operation related to signal amplification of the wireless transmission device 1a shown in FIG. 2 will be described.

The modulation signal generation circuit VCO outputs the radio frequency (RF) modulation signal (RFIN) containing transmission data to the signal selection circuit SSC. On the basis of the control signals en1 to enn from the control circuit CNT, the signal selection circuit SSC distributes the radio frequency (RF) modulation signal (RFIN) to the first to N-th unit amplifiers SWAmp1 to SWAmpN or blocks the same. The radio frequency (RF) modulation signal (RFIN) distributed to the first to N-th unit amplifiers SWAmp1 to SWAmpN is amplified in the class-D amplifying operation by the first to N-th unit amplifiers SWAmp1 to SWAmpN to be output to the matching/adjusting circuit MT. The matching/adjusting circuit MT supplies the amplified radio frequency (RF) modulation signal (RFIN) to the antenna ANT as an output signal OUT after being matched with the impedance of the antenna ANT, and emits the same as a radio signal of the transmission electric power (Pout) from the antenna ANT. The above is the basic operation related to the signal amplification.

Next, a control method for adjusting the transmission electric power (Pout) of the wireless transmission device 1a shown in FIG. 2 will be described using the drawings. FIG. 5 is a diagram for showing an operation state of the selection circuit Sel1 of FIG. 3. FIG. 6 is a diagram for showing an operation state of the first unit amplifying circuit SWAmp1 of FIG. 3. It should be noted that an operation state of the selection circuit Sel1 and an operation state of the first unit amplifying circuit SWAmp1 are shown as representative examples in FIG. 5 and FIG. 6. However, operation states of the second to N-th selection circuits Sel2 to Seln and operation states of the second to N-th unit amplifying circuits SWAmp2 to SWAmpn are the same as those in FIG. 5 and FIG. 6.

In order to adjust the transmission electric power Pout to a desired value, the control signals en1 to enn are output from the control circuit CNT to the first to N-th unit amplifying circuits SWAmp1 to SWAmpn and the signal selection circuit SSC. Each of the control signals en1 to enn is a logic signal, and has a state of the low level (L) or the high level (H). Each of the operation states of the first to N-th selection circuits Sel1 to Seln and the first to N-th unit amplifying circuits SWAmp1 to SWAmpn for the control signals en1 to enn can be referred to in FIG. 5 and FIG. 6.

As shown in FIG. 5, in the case where the control signal en1 is Low (0), the selection circuit Sel1 blocks the RF modulation signal (RFIN). At this time, the output o of the selection circuit Sel1 is fixed to High (1). In the case where the control signal en1 is High (1), the selection circuit Sel1 allows the RF modulation signal (RFIN) to pass through. Thus, in the case where the RF modulation signal (RFIN) is Low (0), the output o of the selection circuit Sel1 outputs the RF modulation signal of Low (0). In the case where the RF modulation signal (RFIN) is High (1), the output o of the selection circuit Sel1 outputs the RF modulation signal of High (1).

As shown in FIG. 6, in the case where the control signal en1 supplied to the sub-control terminal EN1 is Low (0), the sub-output terminal OUT1 of the first unit amplifier SWAmp1 is fixed to the Hi-Z state. In the case where the control signal en1 supplied to the sub-control terminal EN1 is High (1), the first unit amplifier SWAmp1 performs the class-D amplifying operation. By the class-D amplifying operation of the first unit amplifier SWAmp1, the RF modulation signal (RFIN) supplied from the output o of the selection circuit Sel1 to the sub-input terminal IN1 is amplified and output to the sub-output terminal OUT1 of the first unit amplifier SWAmp1.

Here, since the sub-output terminal OUT1 of the first unit amplifier SWAmp1 has three states (tri-state) of "Hi-Z", "1", and "0" in FIG. 6, the first unit amplifier SWAmp1 is referred to as a tri-state switch amplifier (SWAmp). In FIG. 6, a state in which the RF signal output (H/L) is performed corresponds to the class-D amplifying operation of the first unit amplifier SWAmp1. Namely, the number of unit amplifiers (SWAmp1 to SWAmpn) that perform the class-D amplifying operation using the control signals en1 to enn output from the control circuit CNT is fixed, so that the transmission electric power Pout at the antenna ANT shown in FIG. 3 can be adjusted.

By employing a configuration in which the sub-output terminals OUT1 to OUTn of the unit amplifiers SWAmp1 to SWAmpn are coupled in series through the first to N-th output capacitive elements C1 to Cn, a loss caused by the parasitic capacitance can be reduced, and the electric power efficiency when narrowing down the output electric power can be improved.

In Yu Literature, the outputs of a plurality of unit amplifiers are directly coupled. Thus, the parasitic capacitance value of an inactive unit amplifier is seen as it is from the output of a unit amplifier that performs the class-D amplifying operation. In particular, when the number of inactive unit amplifiers is increased to decrease the transmission electric power, the parasitic capacitance thereof can be seen from the unit amplifier that performs the class-D amplifying operation as a simple additional value. Here, a parasitic capacitance value Call that can be seen from the output of the unit amplifier that performs the class-D amplifying operation can be expressed as the following equation 1.

$$\text{Call} = (N-n)Cp \quad \text{Equation 1}$$

Here, Cp represents the unit parasitic capacitance of a unit amplifier, N represents the total number of unit amplifiers, and n represents the total number of unit amplifiers that perform the class-D amplifying operation. In order to simplify the equation, the sizes of all the unit amplifiers are the same. In addition, a charge loss Ploss of the unit amplifier generated by the parasitic capacitance can be expressed as the following equation 2.

$$Ploss = \text{Call} \times (VDD)^2 \times f \quad \text{Equation 2}$$

Here, VDD represents a power supply voltage value supplied to the class-D amplifier, and f represents an input signal frequency.

As being apparent from the equation 2, the charge loss Ploss of the unit amplifier that performs the class-D amplifying operation is increased proportional to the parasitic capacitance, and thus it is important to reduce the parasitic capacitance value.

On the contrary, in the embodiment or the first example, the parasitic capacitance value of a unit amplifying circuit in a non-operation state is seen to be small from the sub-output terminals OUT1 to OUTn of the first to N-th unit amplifying circuits SWAmp1 to SWAmpn that perform the class-D amplifying operation, and thus the charge loss Ploss of the equation 2 can de reduced.

Namely, in the embodiment or the first example, the parasitic capacitance value Call that can be seen from the sub-output terminals OUT1 to OUTn of the first to N-th unit amplifying circuits SWAmp1 to SWAmpn that perform the class-D amplifying operation can be expressed as the following equation 3.

$$\text{Call} = ((n \times Cu)/(n \times Cu + N \times Cp)) \times (N-n) \times Cp \quad \text{Equation 3}$$

Here, Cu represents the capacitance value of each of the first to N-th output capacitive elements C1 to Cn shown in FIG. 1 and FIG. 2. In addition, Cp represents the unit parasitic capacitance of each of the unit amplifiers (SWAmp1 to SWAmpn) as shown in FIG. 3. Namely, Cp represents the parasitic capacitance caused from between the source and the drain of the P-channel MOSFET (PM) and between the source and the drain of the N-channel MOSFET (NM) configuring the inverter circuit INV of each of the unit amplifiers (SWAmp1 to SWAmpn) as described in FIG. 3.

In order to simplify the equation, the sizes of all the first to N-th unit amplifying circuits SWAmp1 to SWAmpn and the first to N-th output capacitive elements C1 to Cn are the same (Cu=C1=C2= . . . =Cn).

The first term of the equation 3 represents a coefficient determined on the basis of a ratio of the total number of output capacitances of the first to N-th unit amplifying circuits SWAmp1 to SWAmpn that perform the class-D amplifying operation to the total number of parasitic capacitances, and the coefficient is equal to or smaller than 1. A relation of 1<(Cu/Cp)<50 between Cu and Cp of the equation 3 is desirable from the viewpoint of the adjustment range and efficiency improvement of the transmission electric power.

In comparison to the equation 1, it is apparent that the parasitic capacitance value Call seen from the first to N-th unit amplifying circuits SWAmp1 to SWAmpn that perform the class-D amplifying operation in the embodiment or the first example becomes small. Thus, the electric power efficiency can be improved by reducing the charge loss Ploss caused by the parasitic capacitance in the embodiment or the first example.

Figure 12:
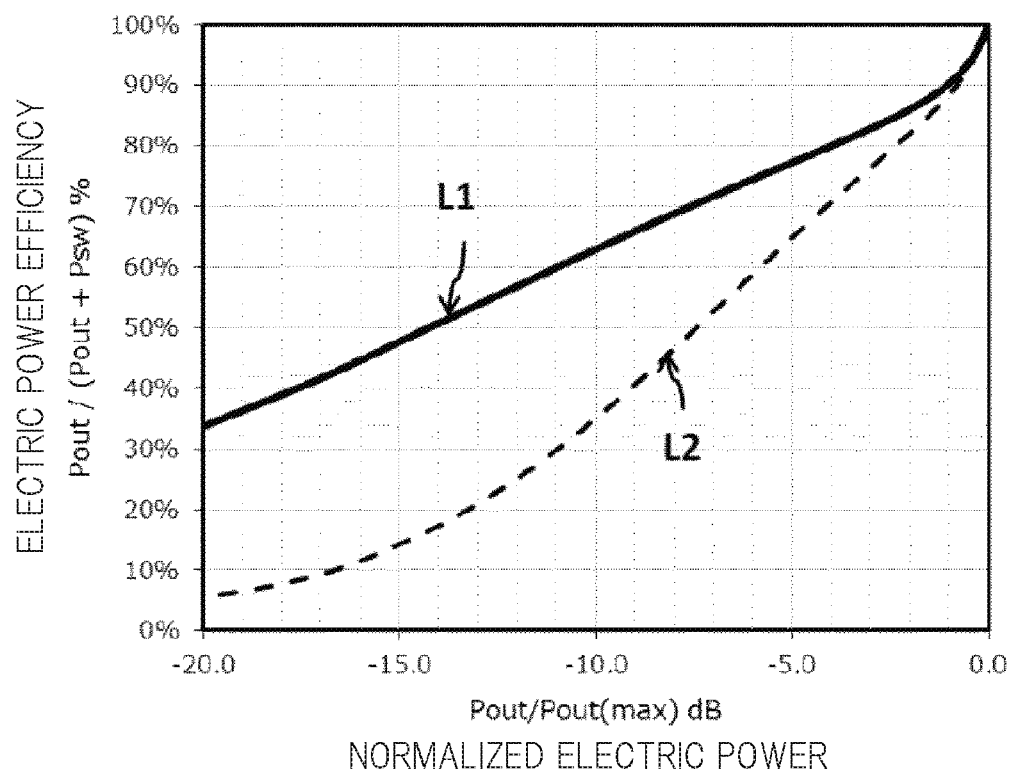
FIG. 12 is a diagram for showing calculation results of electric power efficiency.

FIG. 12 is a diagram for showing calculation results of the electric power efficiency. In FIG. 12, a solid line L1 represents the electric power efficiency of the wireless transmission device (1, 1a) described in the embodiment or the first example. On the other hand, a dotted line L2 represents electric power efficiency by an adjustment method in which the impedance Zout is increased only with the on-resistance (resistance value) of the unit amplifier. The vertical axis represents the electric power efficiency, and the horizontal axis represents an electric power (Pout/Pmax) obtained by normalizing a transmission electric power Pout using a value Pmax that is the maximum output of the transmission electric power Pout.

The electric power efficiency is obtained using the following equation.

$$\text{The electric power efficiency} = Pout/(Pout+Psw)$$

Here, Pout represents a transmission electric power, and Psw represents the charge loss of the unit amplifier generated by the parasitic capacitance.

As the operation conditions of the circuit, the power supply voltage VDD was 1 V (volt), and the input signal frequency f was 2.45 GHz. As the design conditions of the circuit, the total number N of unit amplifiers was 127, the unit parasitic capacitance Cp of the unit amplifier was 0.01 pF, the unit capacitance value Cu of each of the first to N-th output capacitive elements C1 to Cn was 0.1 pF, the on-resistance Ron of the unit amplifier was 100 ohms, a load resistance RL was 50 ohms, and the transmission electric power Pmax of the maximum output was 12.04 dBm.

As can be understood from FIG. 12, the solid line L1 represents the electric power efficiency of 30% or more when the transmission electric power is small (−20.0 dB), and the electric power efficiency is improved as compared to the dotted line L2.

In the above description, the sizes of all the first to N-th unit amplifying circuits SWAmp1 to SWAmpn and the first to N-th output capacitive elements C1 to Cn are the same. However, it is easy to imagine a weighed design such as changing the size of the unit amplifier or the sizes of the unit amplifier and the output capacitance on a binary basis, and the design is included in the disclosure. In addition, the superiority of the above description in the embodiment or the first example is not changed in comparison to the configuration example in the related art in which the similar design was performed. Thus, the improvement in electric power efficiency is effective even if the size design is applied.

Further, the output signal (ANT) making a pair with the input signal (IN) or the sub-outputs (OUT1 to N) have the same carrier frequency in the above description, and the above description is not a technique to adapt to a plurality of channels at the same time such as the multiband.

The carrier frequency in the embodiment or the first example is for a communication system, and thus is generally for a range between several hundreds of MHz and several GHz unlike an audio signal bandwidth (an audible frequency or a frequency related to audio PWM control. The frequency range differs depending on counties and communication types, and thus specific numbers are not specified herein.

Second Example

Figure 7:
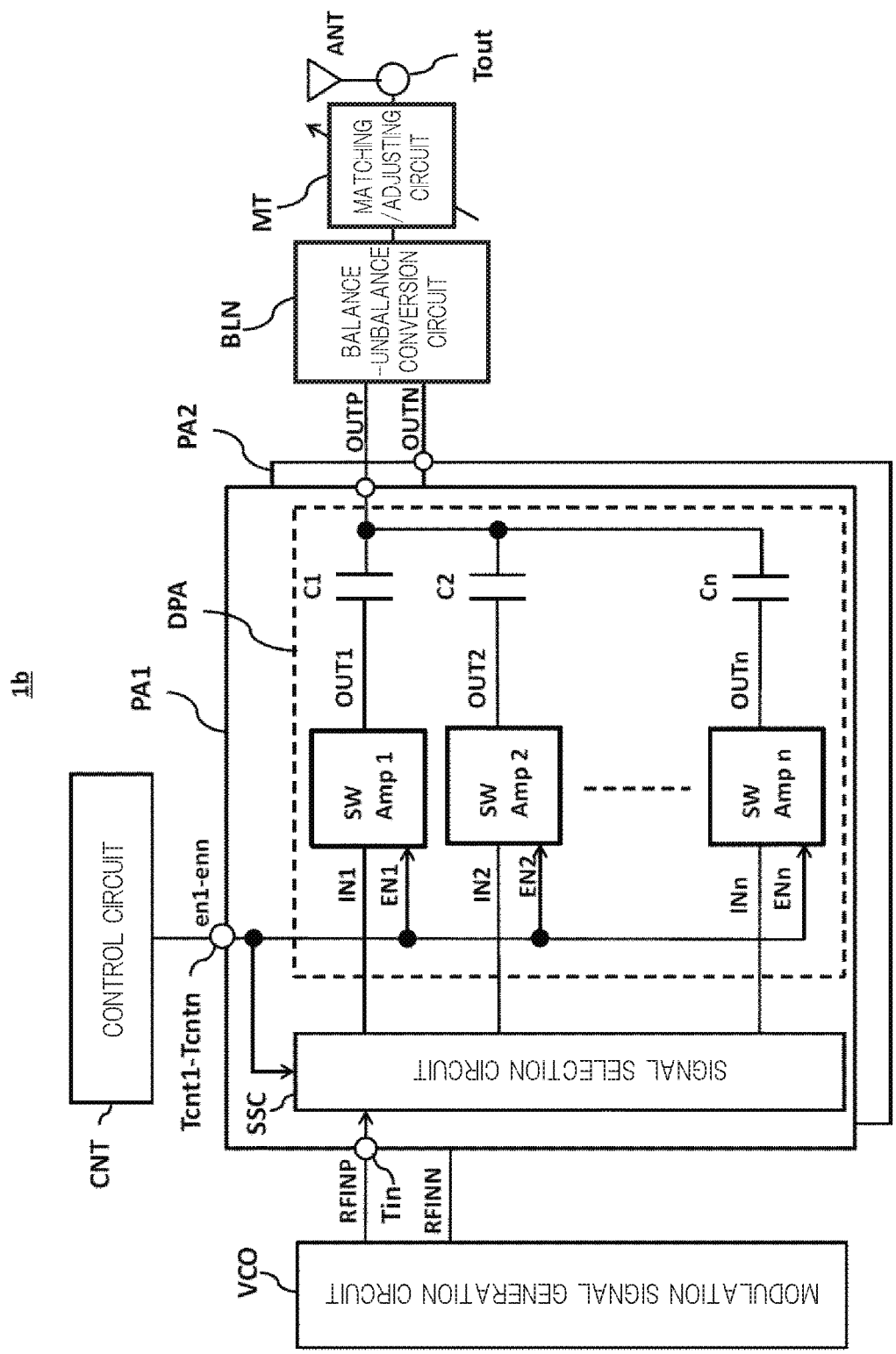
FIG. 7 is a diagram for showing a configuration example of a wireless transmission device according to a second example.

FIG. 7 is a diagram for showing a configuration example of a wireless transmission device according to a second example. A wireless transmission device $1b$ shown in FIG. 7 has a configuration obtained by being extended to a differential configuration circuit. The wireless transmission device $1b$ is configured using a semiconductor device formed on one semiconductor chip except an antenna ANT. Two sets (a first power amplifier PA1 and a second power amplifier PA2) of amplifying circuits DPA each having a set of the signal selection circuit SCC, the first to N-th unit amplifying circuits SWAmp1 to SWAmpn, and the first to N-th output capacitive elements C1 to Cn shown in the first example are prepared. A positive-side input signal RFINP as a positive-side radio frequency modulation signal is input to the first power amplifier PA1, and an amplified positive-side output signal OUTP is output. A negative-side input signal RFINN as a negative-side radio frequency modulation signal is input to the second power amplifier PA2, and an amplified negative-side output signal OUTN is output. The positive-side input signal RFINP and the negative-side input signal RFINN are differential output signals output from a modulation signal generation circuit VCO. The positive-side output signal OUTP and the negative-side output signal OUTN are coupled to a balance-unbalance conversion circuit BLN.

The balance-unbalance conversion circuit BLN is a circuit to convert the differential signals (OUTP and OUTN) into a single signal, and a balun in which a winding number ratio on a on the primary side (amplifying circuit DPA side) to that on the secondary side (antenna ANT side) is optimized is used. As the balance-unbalance conversion circuit BLN, for example, an on-chip balun formed on a semiconductor chip can be used. As the balance-unbalance conversion circuit BLN, a differential synthesizer (so-called "discrete balun") using an L/C phase adjusting circuit can be also used.

The wireless transmission device $1b$ having the differential configuration shown in FIG. 7 is advantageous in an increase in the transmission electric power (Pmax) of the maximum output because the amplitude of the output voltage is twice as large as the wireless transmission device $1a$ having the single configuration as shown in FIG. 2. In order to adjust to a small transmission electric power without deteriorating the electric power efficiency in the wireless transmission device $1b$ having the differential configuration, it is necessary to increase the impedance (Zout) on the antenna ANT side seen from the sub-output terminals OUT1 to OUTn of the first to N-th unit amplifying circuits SWAmp1 to SWAmpn. Here, a relation among Pmax, Zout, and the power supply voltage VDD in the differential configuration is shown as the following equation 4.

$$Pmax \propto (4 \times (VDD)^2)/Zout \qquad \text{Equation 4}$$

Since the impedance (Zout) seen from the sub-output terminals OUT1 to OUTn of the first to N-th unit amplifying circuits SWAmp1 to SWAmpn that perform the class-D amplifying operation can be increased by adjusting the capacitance values of the first to N-th output capacitive elements C1 to Cn in the second example, the electric power efficiency can be improved.

Figure 8:
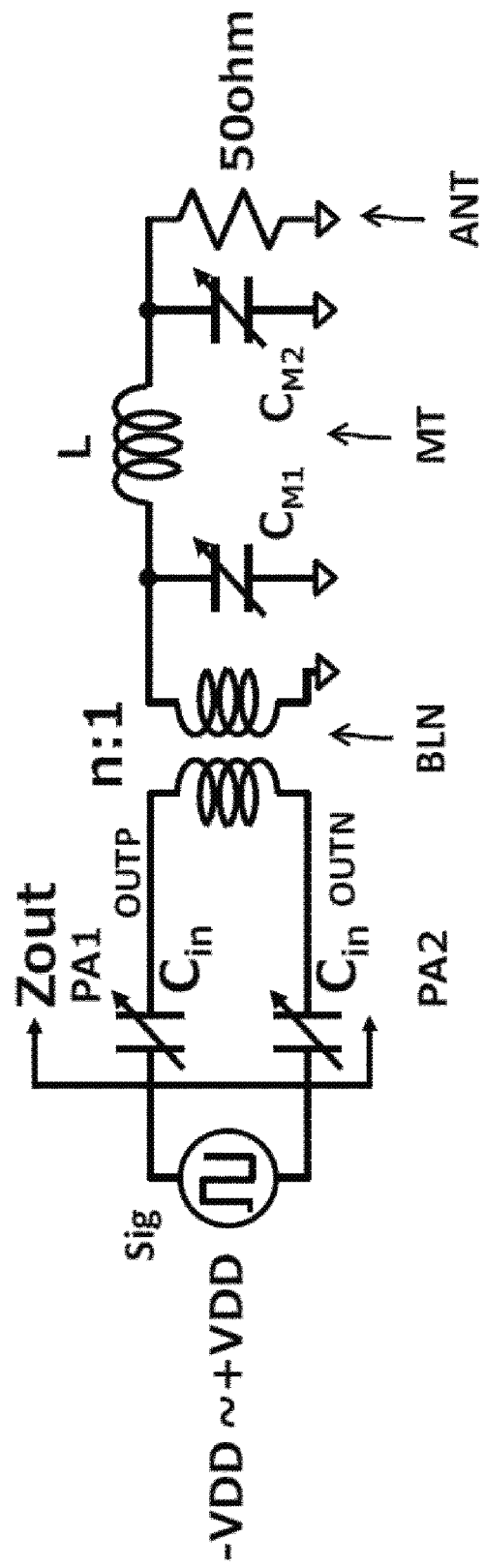
FIG. 8 is an equivalent circuit diagram of the wireless transmission device 1b shown in FIG. 7.

FIG. 8 is an equivalent circuit diagram of the wireless transmission device $1b$ shown in FIG. 7. In FIG. 8, the balance-unbalance conversion circuit BLN is shown as a balun in which the winding number ratio on the primary side (power amplifiers PA1 and PA2 side) to that on the secondary side (antenna ANT side) is n:1. The matching/adjusting circuit MT is shown as an inductor L and variable capacitive elements Cm and CM2, and the antenna ANT is shown as a 50-ohm load resistor. The power amplifiers PA1 and PA2 are shown as a signal source Sig and two variable output capacitances Cin.

By using the trans-impedance and the variable output capacitances Cin of the balun configuring the balance-unbalance conversion circuit BLN, the impedance Zout is adjusted in such a manner that the output capacitances Cin are decreased when the transmission electric power is small and the output capacitances Cin are increased when the transmission electric power is large. Accordingly, the transmission electric power is efficiently adjusted.

Here, the impedance Zout is not increased only with a resistive element as in a method of a comparative example the detail of which will be described later, and thus the efficiency can be improved without causing the heat loss.

The method of the comparative example is a method in which the impedance Zout is adjusted to increase only with the on-resistance (resistance value) of the unit amplifier. Therefore, the heat generation loss due to resistance becomes larger as the transmission electric power becomes smaller, and the electric power efficiency is deteriorated.

In addition, in Yu Literature, the number of unit amplifiers that perform the class-D operation is suppressed and the on-resistance is raised more excessively than the second example so as to adapt to a small transmission electric power. However, there is a risk that the heat loss occurs due to the on-resistance, and the electric power efficiency is deteriorated. Further, in Yu Literature, a large capacitance is used in order not to deteriorate the transmission electric power when a large transmission electric power is output. Thus, there is a risk that the efficiency is deteriorated because of another reason that the charge loss is increased due to the parasitic capacitance of the large capacitance.

Because of being adjusted to the minimum output capacitance value in accordance with the output electric power in the second example, the parasitic capacitance can be reduced, and the charge loss can be reduced. In the second example, the output impedance Zout is increased so as not to generate the heat loss and the charge loss using an approach different from the method in which the impedance Zout is adjusted only with the on-resistance.

In addition to the above, as an approach to increase the output impedance Zout, there is a method in which the winding number ratio of the balun (BLN) is increased or a method in which the impedance adjusting range of the matching/adjusting circuit is widely set. However, the disclosure is excellent because of the following reasons.

In general, the output impedance Zout can be increased by increasing the winding number ratio of the balun (BLN). However, it is not easy to freely change the winding number ratio of the balun later using logic level adjustment or the like, and the winding number ratio is fixed. Therefore, it is difficult to widely adjust the output impedance Zout in the differential configuration.

In general, as similar to the above, there is a method in which the impedance is increased by the matching/adjusting circuit. However, in the case where a matching unit is configured using a n-type matching circuit and the like, the value of the inductor L is fixed as similar to the balun, and a large inductance value is needed in order to have wider impedance adjustment. Therefore, the chip size is increased. It is not preferable to realize the inductor L on a chip because a Q value is decreased due to wiring resistance to cause a power loss.

The adjustment of the capacitance value employed in the disclosure can be easily realized by a combination of the capacitance and the switch. However, there is a possibility that the impedance is changed when seeing the output capacitance direction from the balun, and thus the matching/adjusting circuit MT includes a possibility of adjusting the capacitance value again.

Because of the above reasons, the output capacitance value of the switching amplifier is adjusted as means for increasing the output impedance Zout. In the case where the transmission electric power is controlled to be small, the on-resistance of the unit amplifier that performs the class-D amplifying operation can be decreased, and the output capacitance is also decreased. Thus, it is possible to obtain an effect of improvement in efficiency.

Third Example

Figure 9:
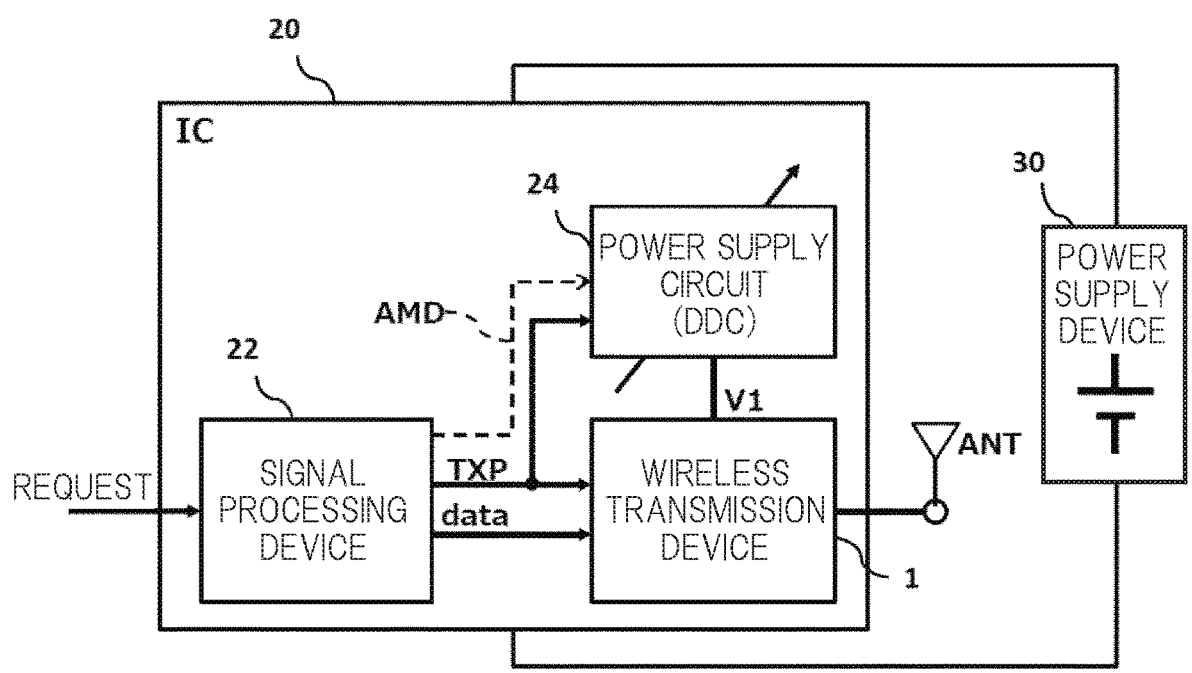
FIG. 9 is a diagram for showing a configuration example of a wireless communication device according to a third example.

FIG. 9 is a diagram for showing a configuration example of a wireless communication device according to a third example.

In FIG. 9, a wireless communication device 10 includes a semiconductor device (IC) 20 and a power supply device 30. The power supply device 30 is configured using a battery, a secondary battery, and the like, and supplies a first reference potential (VDD), a second reference potential (GND), and the like to the semiconductor device 20.

The semiconductor device IC includes a wireless transmission device 1, a signal processing device 22, and a power supply circuit 24. The wireless transmission device 1 is configured using the wireless transmission device (1, 1a, or 1b) described in the embodiment, the first example, and the second example.

The signal processing device 22 receives external request data containing information of necessary transmission data and a transmission electric power, and supplies transmission data and a transmission electric power control value TXP to the wireless transmission device 1. In addition, the transmission electric power control value TXP is also supplied to the power supply circuit 24.

The wireless transmission device 1 up-converts the transmission data data to an RF frequency, and outputs the same from an antenna ANT after adjusting to a necessary electric power. The transmission data data is supplied to a modulation signal generation circuit VCO in the wireless transmission device 1. The modulation signal generation circuit VCO up-converts the transmission data data to an RF frequency to generate a radio frequency modulation signal (RFIN or RFINP/RFINN). The transmission electric power control value TXP is supplied to a control circuit CNT in the wireless transmission device 1. The control circuit CNT generates control signals en1 to enn used for electric power adjustment on the basis of the transmission electric power control value TXP.

The power supply circuit 24 controls the voltage value of an output voltage V1 so as to be the minimum voltage in accordance with a requested transmission electric power on the basis of the transmission electric power control value TXP from the signal processing device 22. The output voltage V1 is supplied to the wireless transmission device 1 as a power supply voltage VDD serving as a first reference potential. Thus, the power supply voltage (VDD or V1) supplied to the wireless transmission device 1 can vary. The power supply circuit 24 can use, for example, a step-down DC-DC converter DDC whose output voltage can vary. Accordingly, the electric power conversion efficiency of the step-down DC-DC converter DDC can be enhanced, and a loss in the wireless transmission device 1 can be reduced. In addition, the efficiency as the wireless communication device 10 can be enhanced.

At this time, for example, the output voltage of the step-down DC-DC converter DDC may vary in a range where a voltage value necessary for the maximum transmission electric power that may be required is set as the maximum value and a voltage value with which a transmission device can operate is set as the minimum value. In the case where the output voltage V1 of the power supply circuit 24 is used other than an amplifying circuit (DPA) in the wireless communication device 10, it is necessary to consider a voltage value necessary for a circuit other than the amplifying circuit (DPA) to operate as requirements for the minimum value. Thus, it is difficult to widely adjust the transmission electric power by changing only the power supply voltage (VDD or V1). However, it is possible to efficiently adjust the value of the transmission electric power in a wide range by being combined with the disclosure.

Further, as shown by the dotted line in FIG. 9, amplitude modulation data AMD is input from the signal processing device 22 to the power supply circuit 24, so that it is possible to obtain an output signal OUT with the amplitude modulated or a positive-side output signal and a negative-side output signal with the amplitudes modulated. Accordingly, it is possible to apply to a wireless communication device including amplitude/phase modulation such as polar modulation.

According to the third example, the wireless transmission device 1 can adapt to a wide range of transmission electric power, and the current consumption can be suppressed. Thus, in the case where a battery is used in the power supply device 30, the battery can last long.

MODIFIED EXAMPLES

Next, modified examples of the power amplifier PA will be described. Power amplifiers (PAa and PAb) in a first modified example and a second modified example can be applied to the amplifying circuit DPA described in the embodiment and the power amplifiers (PA, PA1, and PA2) described in the first example and the second example.

In addition, as a third modified example, a modified example of the first unit amplifying circuit and the first selection circuit will be described. A first unit amplifying circuit SWAmp1 and a first selection circuit Sel1 shown in the third modified example can be applied to the unit amplifying circuits SWAmp1 to SWAmpn and the selection circuits Sel1 to Seln in the embodiment, the first example, the second example, the first modified example, and the second modified example.

First Modified Example

Figure 10:
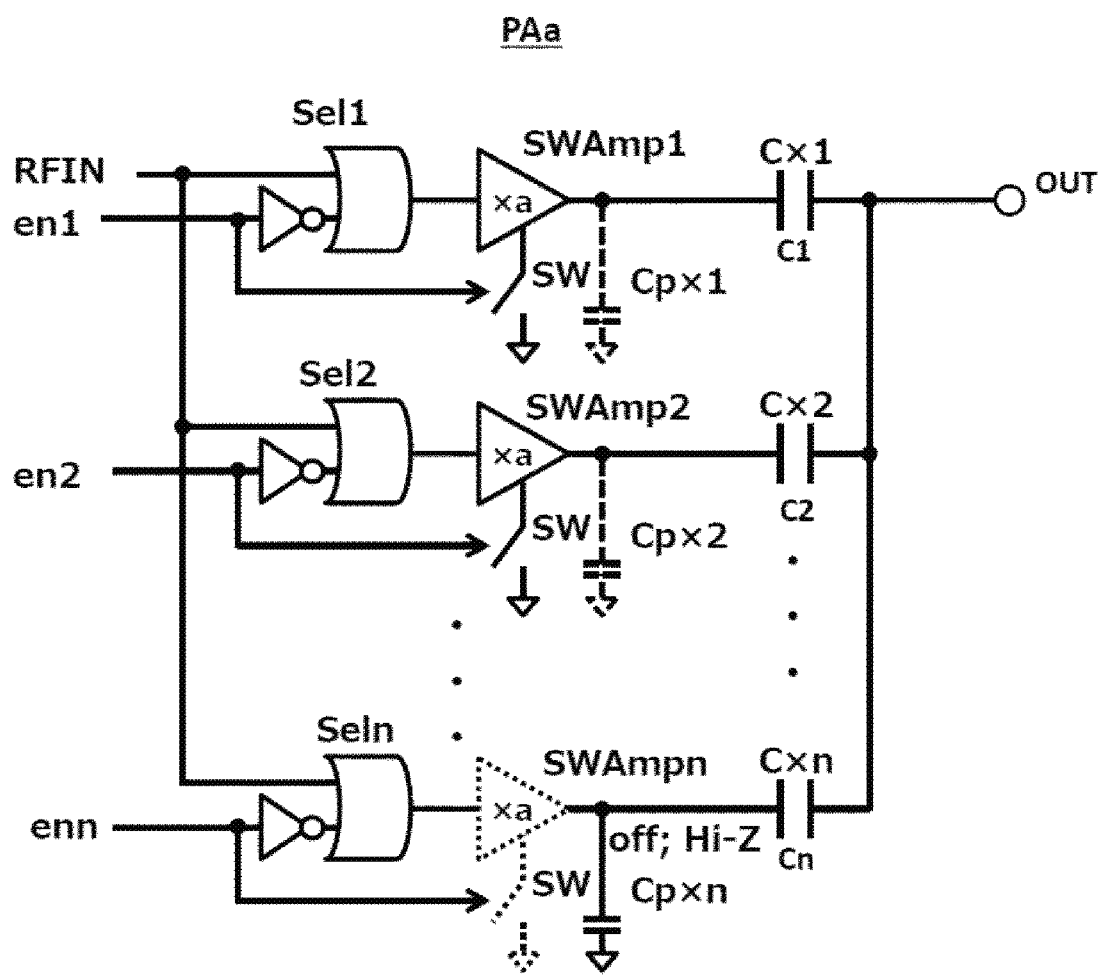
FIG. 10 is a diagram for showing a configuration example of a power amplifier according to a first modified example.

FIG. 10 is a diagram for showing a configuration example of a power amplifier according to a first modified example. A power amplifier PAa according to the first modified example is configured in such a manner that the transistor sizes (the gate widths W of MOSFETs) of P-channel MOSFETs (PM) and N-channel MOSFETs (NM) configuring first to N-th unit amplifying circuits SWAmp1 to SWAmpn are the same (xa), and the sizes of first to N-th output capacitive elements C1 to Cn are different from each other.

The capacitance value of the first output capacitive element C1 is C×1, the capacitance value of the second output capacitive element C2 is C×2, and the capacitance value of the N-th output capacitive element Cn is C×n. Namely, the capacitance values of the first to N-th output capacitive elements C1 to Cn are weighted. The transmission electric power is adjusted by switching the capacitance size. Accordingly, a loss caused by the on-resistance can be minimized. However, it is desirable to sufficiently increase the transistor sizes of the P-channel MOSFETs (PM) and the N-channel MOSFETs (NM) configuring the first to N-th unit amplifying circuits SWAmp1 to SWAmpn so as not to generate a loss due to the on-resistance.

Second Modified Example

Figure 11:
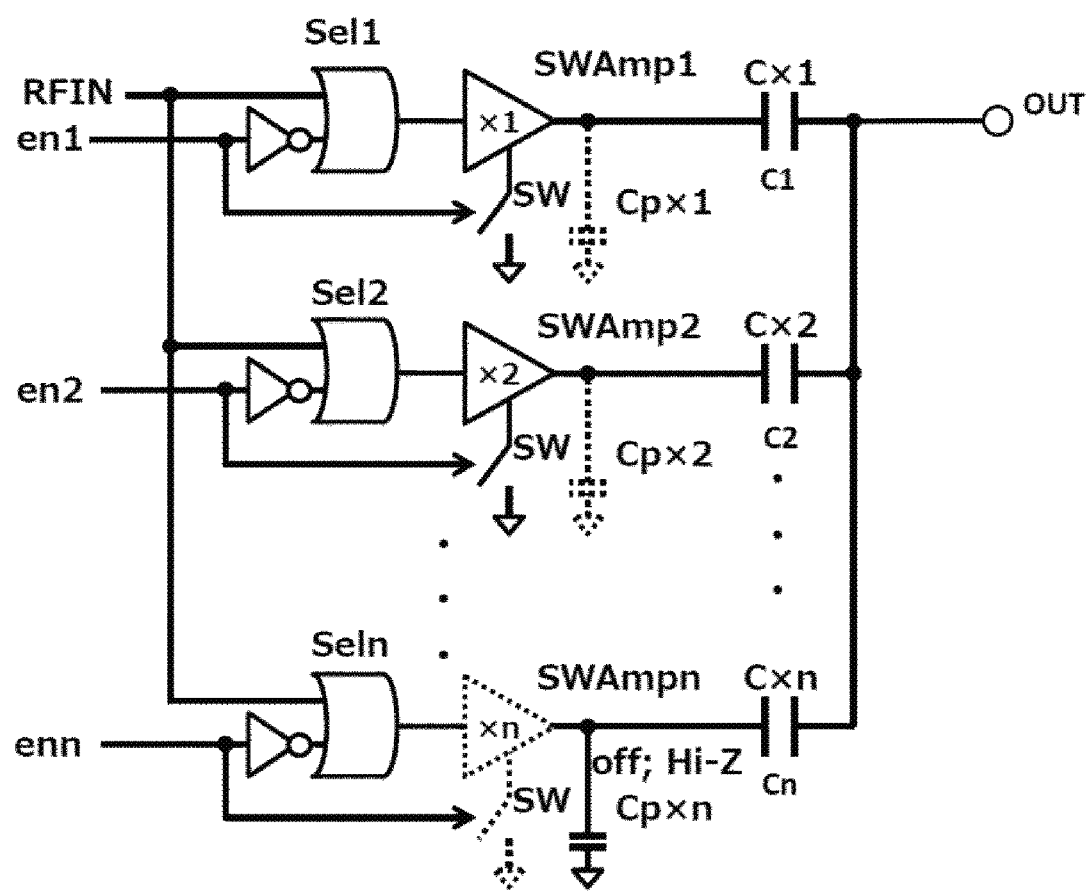
FIG. 11 is a diagram for showing a configuration example of a power amplifier according to a second modified example.

FIG. 11 is a diagram for showing a configuration example of a power amplifier according to a second modified example. A power amplifier PAb according to the second modified example is configured in such a manner that the transistor sizes (the gate widths W of MOSFETs) of P-channel MOSFETs (PM) and N-channel MOSFETs (NM) configuring first to N-th unit amplifying circuits SWAmp1 to SWAmpn are different from each other, and the sizes (the capacitance values or the electrostatic capacitance values) of first to N-th output capacitive elements C1 to Cn are different from each other.

The transistor size of the first unit amplifying circuit SWAmp1 is ×1, the transistor size of the second unit amplifying circuit SWAmp2 is ×2, and the transistor size of the N-th unit amplifying circuit SWAmpn is ×n. Namely, the transistor sizes of the first to N-th unit amplifying circuits SWAmp1 to SWAmpn are weighted.

As similar to the above, the capacitance value of the first output capacitive element C1 is C×1, the capacitance value of the second output capacitive element C2 is C×2, and the capacitance value of the N-th output capacitive element Cn is C×n. Namely, the capacitance values of the first to N-th output capacitive elements C1 to Cn are weighted.

Namely, the sizes of the transistors (PM and NM) configuring the first to N-th unit amplifying circuits SWAmp1 to SWAmpn and the electrostatic capacitances of the first to N-th output capacitive elements C1 to Cn have a relation in which as the transistor sizes increase, the electrostatic capacitances increase.

Third Modified Example

FIGS. 13A, 13B and 13C are diagrams each explaining a configuration example of a first unit amplifier and a first selection circuit according to a third modified example. FIG. 13A is a circuit diagram for showing a configuration example of the first unit amplifier and the first selection circuit. FIG. 13B is a circuit diagram for showing a configuration example of an inverter circuit INV in the first unit amplifier. FIG. 13C is a diagram for showing operation states of the first unit amplifier and the first selection circuit shown in FIG. 13A. FIGS. 13A, 13B and 13C exemplify circuit configurations of a first unit amplifier SWAmp1 and a first selection circuit Sel1. Second to N-th unit amplifying circuits SWAmp2 to SWAmpn and second to N-th selection circuits Sel2 to Seln can be configured similar to the first unit amplifier SWAmp1 and the first selection circuit Sel1 shown in FIGS. 13A, 13B and 13C.

FIG. 13A is different from FIG. 3 in that an AND circuit AND is added in the first selection circuit Sel1 and two input terminals (IN1a and IN1b) of an inverter circuit INV in the first unit amplifier SWAmp1 are coupled to an output o of an OR circuit OR and an output o of the AND circuit AND, respectively. Hereinafter, points different from FIG. 3 will be mainly described in FIG. 13.

With reference to FIG. 13A, the inverter circuit INV in the first unit amplifying circuit SWAmp1 is configured to have a first input (sub-input terminal IN1a) and a second input (sub-input terminal IN1b). The output o of the OR circuit OR is coupled to the first input (sub-input terminal IN1a) of the inverter circuit INV.

The AND circuit AND has a first input i1 which is coupled to an input terminal Tin and to which an output signal RFIN is supplied, a second input i2 which is coupled to a control terminal Tcnt1 to receive a control signal en1, and the output o coupled to the second input (sub-input terminal IN1b) of the inverter circuit INV in the first unit amplifying circuit SWAmp1.

As shown in FIG. 13B, an inverter circuit INV in the first unit amplifying circuit SWAmp1 includes a P-channel MOSFET (PM) and an N-channel MOSFET (NM). The source-drain route of the P-channel MOSFET (PM) and the source-drain route of the N-channel MOSFET (NM) are coupled in series between a first reference potential VDD serving as a power supply potential and a second reference potential GND serving as a ground potential. A gate electrode of the P-channel MOSFET (PM) configures a first input (sub-input terminal IN1a) of the inverter circuit INV, and a gate electrode of the N-channel MOSFET (NM) configures a second input (sub-input terminal IN1b) of the inverter circuit INV. A common connection point between the source-drain route of the P-channel MOSFET (PM) and the source-drain route of the N-channel MOSFET (NM) configures a sub-output terminal OUT1.

As shown in FIG. 13C, in the case where the control signal en1 is Low (0), the selection circuit Sel1 blocks an RF modulation signal (RFIN). At this time, the sub-input terminal IN1a becomes High (1), and the sub-input terminal IN1b becomes Low (0). Thus, the sub-output terminal OUT1 becomes a high impedance (Hi-Z) state. In the case where the control signal en1 is High (1), the selection circuit Sel1 allows the RF modulation signal (RFIN) to pass through. At this time, the sub-input terminal IN1a and the sub-input terminal IN1b become the signal level of the RF modulation signal (RFIN), and the RF modulation signal (RFIN) is amplified to be output to the sub-output terminal OUT1.

The invention achieved by the inventors has been concretely described above on the basis of the examples. However, it is obvious that the present invention is not limited to the above-described embodiment and examples, and can be variously changed.

What is claimed is:

1. A wireless transmission device comprising:
an input terminal;
a plurality of control terminals;
an amplifying circuit;
a matching circuit having an input and an output; and
an output terminal coupled to the output of the matching circuit,
wherein the amplifying circuit includes a plurality of unit amplifiers and a plurality of capacitive elements,
wherein each of the unit amplifiers includes a sub-input terminal, a sub-control terminal, and a sub-output terminal,
wherein the sub-input terminal is coupled to the input terminal,
wherein the sub-control terminal is coupled to the corresponding control terminal in the control terminals,
wherein the sub-output terminal is coupled to the input of the matching circuit through the corresponding capacitive element in the capacitive elements in series,
wherein each of the unit amplifiers includes a tri-state-type class-D amplifier, and
wherein the sub-output terminal of each of the unit amplifiers is set to a low level state, a high level state, or a high impedance state on the basis of a control signal supplied to the sub-control terminal or an input signal supplied to the sub-input terminal.

2. The wireless transmission device according to claim 1, wherein the electric power of an output signal output from the output terminal is controlled on the basis of the control signal.

3. The wireless transmission device according to claim 2, further comprising a signal selection circuit having a plurality of selection circuits,
wherein each of the selection circuits includes:
an input coupled to the input terminal;
an output coupled to the sub-input terminal of the corresponding unit amplifier in the unit amplifiers; and
a control input coupled to the sub-control terminal of the corresponding unit amplifier, and
wherein each of the selection circuits includes a first state in which the input terminal and the input are coupled to each other on the basis of the control signal, and a second state in which the input terminal and the input are disconnected from each other.

4. The wireless transmission device according to claim 3, further comprising a modulation signal generation circuit and a control circuit,
wherein the modulation signal generation circuit supplies a radio frequency (RF) modulation signal to the input terminal on the basis of transmission data, and
wherein the control circuit supplies the control signal to the control terminals.

5. The wireless transmission device according to claim 4, wherein each of the unit amplifiers is configured using a transistor, and
wherein the size of the transistor configuring the unit amplifiers and the electrostatic capacitance value of each of the capacitive elements have a relation in which as the size of the transistor increases, the electrostatic capacitance value increases.

6. The wireless transmission device according to claim 4, wherein each of the unit amplifiers includes a P-channel MOSFET, an N-channel MOSFET, and a switch, and
wherein the source-drain route of the P-channel MOSFET, the source-drain route of the N-channel MOSFET, and the switch are coupled in series between a first reference potential and a second reference potential whose voltage is lower than the first reference potential.

7. The wireless transmission device according to claim 6, wherein the source-drain route of the P-channel MOSFET is coupled between the first reference potential and the source-drain route of the N-channel MOSFET, and
wherein the switch is coupled between the source-drain route of the N-channel MOSFET and the second reference potential.

8. A wireless communication device comprising:
a wireless transmission device according to claim 4;
a power supply circuit that supplies a power supply potential to the wireless transmission device; and
a signal processing device that supplies the transmission data and a transmission electric power control value,
wherein the power supply circuit variably controls the power supply potential on the basis of the transmission electric power control value, and
wherein the control circuit generates the control signal on the basis of the transmission electric power control value.

9. The wireless communication device according to claim 8,
wherein amplitude modulation data is supplied to the power supply circuit.

10. A wireless transmission device comprising:
a modulation signal generation circuit that outputs a positive-side radio frequency modulation signal and a negative-side radio frequency modulation signal on the basis of transmission data;
a first power amplifier to which the positive-side radio frequency modulation signal is input and which outputs a positive-side output signal;
a second power amplifier to which the negative-side radio frequency modulation signal is input and which outputs a negative-side output signal;
a balance-unbalance conversion circuit to which the positive-side output signal and the negative-side output signal are input;
a matching circuit coupled to an output of the balance-unbalance conversion circuit;
an output terminal coupled to an output of the matching circuit; and
a control circuit that outputs a plurality of control signals,
wherein each of the first power amplifier and the second power amplifier includes a plurality of unit amplifiers and a plurality of capacitive elements,
wherein each of the unit amplifiers includes a sub-input terminal, a sub-control terminal, and a sub-output terminal,
wherein the positive-side radio frequency modulation signal or the negative-side radio frequency modulation signal is input to the sub-input terminal,
wherein the corresponding control signal is input to the sub-control terminal,
wherein the sub-output terminal is coupled to an input of the balance-unbalance conversion circuit through the corresponding capacitive element in series,
wherein each of the unit amplifiers includes a tri-state-type class-D amplifier, and
wherein the sub-output terminal of each of the unit amplifiers is set to a low level state, a high level state, or a high impedance state on the basis of the corresponding control signal supplied to the sub-control terminal and the positive-side radio frequency modulation signal or the negative-side radio frequency modulation signal supplied to the sub-input terminal.

11. The wireless transmission device according to claim 10,
wherein the electric power of an output signal output from the output terminal is controlled on the basis of the control signals.

12. The wireless transmission device according to claim 10,
wherein each of the first power amplifier and the second power amplifier includes a signal selection circuit having a plurality of selection circuits,
wherein each of the selection circuits includes:
an input to which the positive-side radio frequency modulation signal or the negative-side radio frequency modulation signal is supplied;
an output coupled to the sub-input terminal of the corresponding unit amplifier in the unit amplifiers; and
a control input coupled to the sub-control terminal of the corresponding unit amplifier, and
wherein each of the selection circuits includes a first state in which the positive-side radio frequency modulation signal or the negative-side radio frequency modulation signal is supplied to the sub-input terminal on the basis of the corresponding control signal, and a second state in which the supply of the positive-side radio frequency modulation signal or the negative-side radio frequency modulation signal to the sub-input terminal is blocked.

13. The wireless transmission device according to claim 12,
wherein each of the unit amplifiers is configured using a transistor, and
wherein the size of the transistor configuring the unit amplifiers and the electrostatic capacitance value of each of the capacitive elements have a relation in which as the size of the transistor increases, the electrostatic capacitance value increases.

14. The wireless transmission device according to claim 12,
wherein each of the unit amplifiers includes a P-channel MOSFET, an N-channel MOSFET, and a switch, and
wherein the source-drain route of the P-channel MOSFET, the source-drain route of the N-channel MOSFET, and the switch are coupled in series between a first reference potential and a second reference potential whose voltage is lower than the first reference potential.

15. The wireless transmission device according to claim 14,
wherein the source-drain route of the P-channel MOSFET is coupled between the first reference potential and the source-drain route of the N-channel MOSFET, and
wherein the switch is coupled between the source-drain route of the N-channel MOSFET and the second reference potential.

16. A wireless communication device comprising:
a wireless transmission device according to claim 10;
a power supply circuit that supplies a power supply potential to the wireless transmission device; and
a signal processing device that supplies the transmission data and a transmission electric power control value,
wherein the power supply circuit variably controls the power supply potential on the basis of the transmission electric power control value, and
wherein the control circuit generates the control signals on the basis of the transmission electric power control value.

17. The wireless communication device according to claim 16,
wherein amplitude modulation data is supplied to the power supply circuit.

* * * * *